US011915967B2

(12) United States Patent
Zhang et al.

(10) Patent No.: US 11,915,967 B2
(45) Date of Patent: Feb. 27, 2024

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei (CN)

(72) Inventors: Kui Zhang, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 226 days.

(21) Appl. No.: 17/599,782

(22) PCT Filed: May 18, 2021

(86) PCT No.: PCT/CN2021/094445
§ 371 (c)(1),
(2) Date: Sep. 29, 2021

(87) PCT Pub. No.: WO2022/022017
PCT Pub. Date: Feb. 3, 2022

(65) Prior Publication Data
US 2023/0068421 A1 Mar. 2, 2023

(30) Foreign Application Priority Data
Jul. 27, 2020 (CN) .......................... 202010733747.3

(51) Int. Cl.
*H01L 21/762* (2006.01)
*H01L 21/764* (2006.01)
(Continued)

(52) U.S. Cl.
CPC ...... *H01L 21/76224* (2013.01); *H01L 21/764* (2013.01); *H10B 12/053* (2023.02); *H10B 12/34* (2023.02); *H10B 12/488* (2023.02)

(58) Field of Classification Search
CPC .... H10B 12/053; H10B 12/34; H10B 12/488; H01L 21/76224; H01L 21/764
See application file for complete search history.

(56) References Cited

U.S. PATENT DOCUMENTS 6,406,975 B1 6/2002 Lim et al.
8,603,890 B2 * 12/2013 Purayath ............... H01L 21/764
438/257

(Continued)

FOREIGN PATENT DOCUMENTS

CN 103811513 A 5/2014
CN 103855166 A 6/2014

(Continued)

OTHER PUBLICATIONS

Seaward et al., An analytical study of etch and etch-stop reactions for GaAs on AlGaAs in CCl2F2 plasma, Journal of Applied Physics 61, 2358-2364 (1987) (Year: 1987).*

(Continued)

*Primary Examiner* — Mary A Wilczewski
*Assistant Examiner* — Jaesun Lee
(74) *Attorney, Agent, or Firm* — Cooper Legal Group, LLC

(57) ABSTRACT

The present disclosure discloses a semiconductor device manufacturing method and a semiconductor device, relating to the technical field of semiconductors. The method includes: providing a semiconductor substrate, the semiconductor substrate comprising a shallow trench and active areas isolated from the shallow trench; forming an oxygen-containing layer on exposed outer surfaces of the shallow trench and the active areas; filling a first sacrificial layer of a set height in the shallow trench comprising the oxygen-containing layer on its surface; forming an etch stop layer on an upper surface of the first sacrificial layer; removing the first sacrificial layer below the etch stop layer to form an air (Continued)

gap; filling an isolation layer on the etch stop layer in the shallow trench to form a shallow trench isolation(STI) structure containing the air gap; and etching the active areas and the (STI) structure to form wordline trenches.

18 Claims, 16 Drawing Sheets

(51) Int. Cl.
  *H10B 12/10* (2023.01)
  *H10B 12/00* (2023.01)

(56) References Cited

U.S. PATENT DOCUMENTS

| | | | | |
|---|---|---|---|---|
| 9,166,012 | B2 * | 10/2015 | Sim | ................. H01L 21/764 |
| 9,496,488 | B2 | 11/2016 | Kwon et al. | |
| 9,524,904 | B2 * | 12/2016 | Ohori | ................ H01L 21/76802 |
| 10,727,232 | B2 * | 7/2020 | Kumar | ................ H01L 29/4966 |
| 2011/0309430 | A1 | 12/2011 | Purayath et al. | |
| 2014/0175555 | A1 * | 6/2014 | Lee | ................. H01L 21/76224 |
| | | | | 438/424 |
| 2015/0108561 | A1 | 4/2015 | Kim et al. | |
| 2016/0111326 | A1 | 4/2016 | Ohori et al. | |
| 2016/0126179 | A1 | 5/2016 | Takahashi et al. | |
| 2016/0260726 | A1 | 9/2016 | Shin et al. | |
| 2020/0144272 | A1 * | 5/2020 | Kumar | ................ H01L 29/4966 |
| 2020/0395461 | A1 * | 12/2020 | Kim | .................... H10B 12/34 |
| 2022/0102489 | A1 * | 3/2022 | Yu | .................. H01L 21/76229 |
| 2022/0216210 | A1 * | 7/2022 | Wei | ..................... H10B 12/315 |
| 2022/0415367 | A1 * | 12/2022 | Yan | ..................... H10B 12/315 |
| 2023/0032102 | A1 * | 2/2023 | Mei | .................... H01L 21/743 |
| 2023/0061921 | A1 * | 3/2023 | Shao | .................... H10B 12/34 |

FOREIGN PATENT DOCUMENTS

| | | | | |
|---|---|---|---|---|
| CN | 107946232 A | * | 4/2018 | |
| CN | 106298673 B | | 9/2019 | |
| WO | WO-2022022055 A1 | * | 2/2022 | ....... H01L 21/76224 |

OTHER PUBLICATIONS

International Search Report cited in PCT/CN2021/094445 dated Aug. 20, 2021, 9 pages.

* cited by examiner

METHOD FOR MANUFACTURING SEMICONDUCTOR DEVICE AND SEMICONDUCTOR DEVICE

CROSS-REFERENCE TO RELATED APPLICATIONS

The present disclosure claims the priority to Chinese Patent Application 202010733747.3, titled "METHOD FOR MANUFACTURING SEMICONDUCTOR DEVICE AND SEMICONDUCTOR DEVICE", filed on Jul. 27, 2020, which is incorporated herein by reference in its entirety.

TECHNICAL FIELD

The present disclosure relates to the technical field of semiconductors, and in particular, to a method for manufacturing a semiconductor device and a semiconductor device.

BACKGROUND

In the sub-micron technology, shallow trench isolation (STI) structures have replaced other semiconductor device isolation methods, for example the local oxidation of silicon (LOCOS) technology which requires a larger valuable area.

In the shallow trench isolation process, shallow trenches are formed in the semiconductor substrate between the semiconductor active areas (which, for example, may be used to form the gate and the source/drain), and the MOSFETs are electrically isolated from each other. The shallow trench is filled with insulating material, for example silicon oxide, to provide electrical insulation.

In the related technologies, when WL (wordline) trenches are formed, due to the etch selectivity ratio, the depths of the WL trenches formed in the active areas and the STI are different, so that the metal gates of the WLs formed by deposition are different in depth at the bottoms of the WL trenches. As a result, the metal gate in the STI structure may be coupled with the active area and the adjacent gate to form the parasitic capacitance which in turn leads to current leakage.

In addition, the different depth of the metal gates at the bottom also lengthens the effective length of the wire and increases the wire resistance.

It is to be noted that the information disclosed in the background section is only provided to facilitate the understanding of the background of the present disclosure, and therefore may include information that does not constitute the existing technologies known to a person of ordinary skill in the art.

SUMMARY

An embodiment of the present disclosure provides a method for manufacturing a semiconductor device, comprising: providing a semiconductor substrate, the semiconductor substrate comprising a shallow trench and active areas isolated from the shallow trench; forming an oxygen-containing layer on exposed outer surfaces of the shallow trench and the active areas; filling a first sacrificial layer of a set height in the shallow trench comprising the oxygen-containing layer on the surface of the shallow trench, the set height being lower than heights of the active areas; forming an etch stop layer on an upper surface of the first sacrificial layer; removing the first sacrificial layer below the etch stop layer to form an air gap; filling an isolation layer on the etch stop layer in the shallow trench to form a shallow trench isolation structure containing the air gap; and etching the active areas and the shallow trench isolation structure to form wordline trenches, wherein bottoms of the wordline trenches in the shallow trench isolation structure are higher than the set height.

An embodiment of the present disclosure provides a semiconductor device, comprising: a semiconductor substrate, comprising: a shallow trench; and active areas isolated from the shallow trench; wherein, an oxygen-containing layer is formed at a bottom of the shallow trench and surfaces of the active areas; an etch stop layer is formed at a set height of the shallow trench, the etch stop layer and the shallow trench forming an air gap, the set height being lower than heights of the active areas; a shallow trench isolation structure containing the air gap is formed on the etch stop layer in the shallow trench, and the shallow trench isolation structure is formed by filling an isolation layer; and wordline trenches are formed in the shallow trench isolation structure and the active areas, wherein bottoms of the wordline trenches in the shallow trench isolation structure are higher than the set height.

In the method for manufacturing the semiconductor device according to some embodiments of the present disclosure, on one hand, an etch stop layer is formed at a set height of the first sacrificial layer in the shallow trench during the formation of the STI so that, during the subsequent formation of the WL trenches by etching, the further etching of the WL trenches in the STI structure can be stopped by the etch stop layer. In this way, the depths of WL trenches almost the same as those of the WL trenches in the active areas may be formed in the STI structure. Since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. Meanwhile, the length of the WLs can be shortened to reduce the conductive resistance. On the other hand, by forming an air gap in the lower part of the STI structure, the isolation effect may be better, and the parasitic capacitance may be further reduced.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
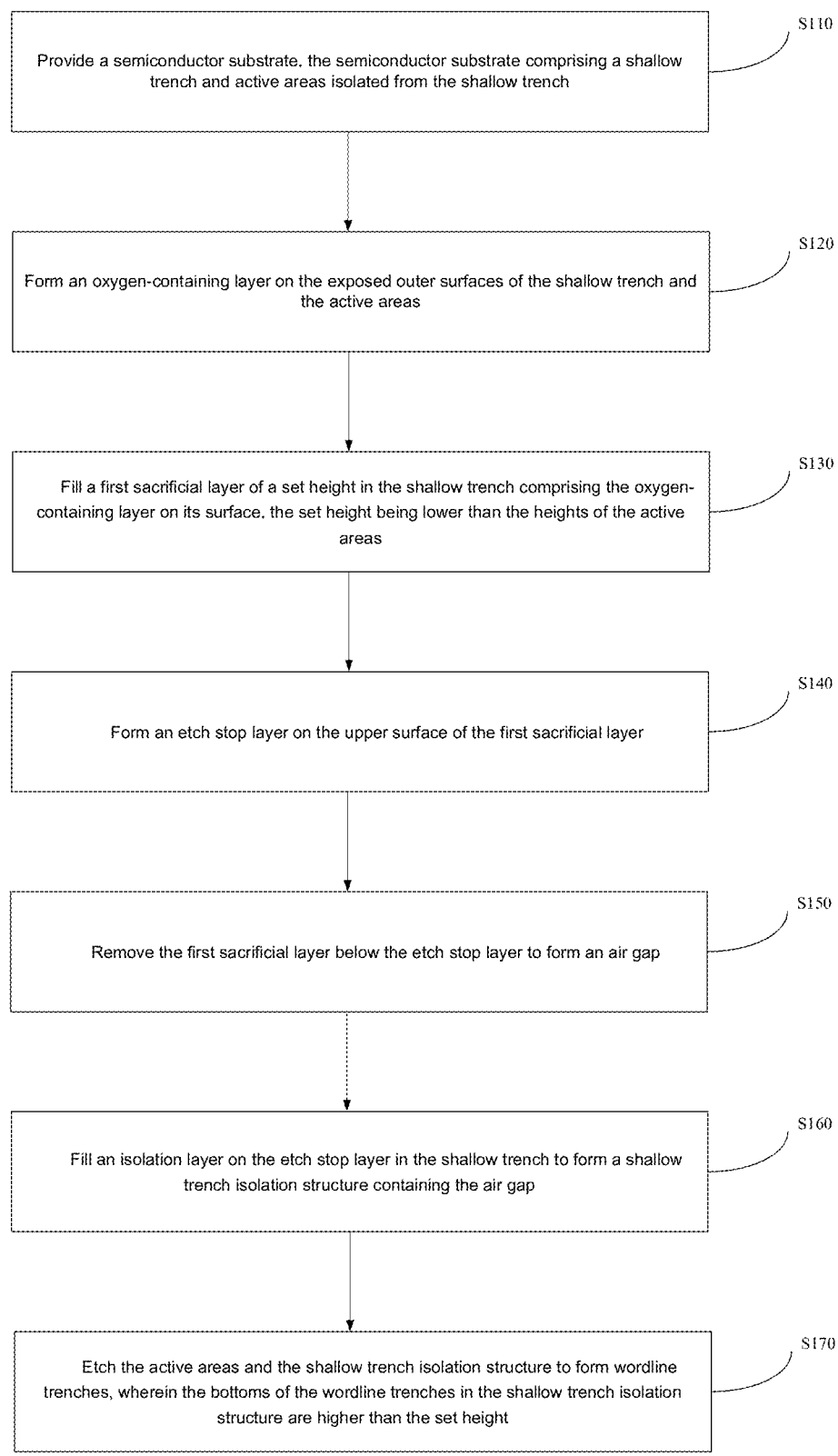
FIG. 1 schematically shows a flowchart of a method for manufacturing a semiconductor device according to an embodiment of the present disclosure.

Exemplary implementations will now be described more fully with reference to the accompanying drawings. However, the exemplary implementations may be implemented in various forms, and should not be construed as being limited to the implementations set forth herein; instead, these implementations are provided to make the present disclosure more comprehensive and complete, and to fully convey the concepts of the exemplary implementations to those skilled in the art. The same reference numerals in the figures denote the same or similar structures, and thus the repeated description thereof will be omitted. In addition, the drawings are merely schematic illustrations of the present disclosure, and are not necessarily drawn to scale.

Although relative terms such as "upper" and "lower" are used in this specification to describe the relative relationship between one component and another component, these terms are used in this specification just for convenience, for example, in the direction as shown in the drawings. It can be understood that, if the device as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "the", "said" and "at least one" are used to indicate the presence of one or more elements/components/etc.; the terms "comprising" and "having" are used to indicate non-exclusive inclusion and indicate the presence of other elements/components/etc. in addition to the listed elements/components/etc.; and the terms "first" and "second" are used only as marks, rather than limiting the number of objects.

FIG. 1 schematically shows a flowchart of a method for manufacturing a semiconductor device according to an embodiment of the present disclosure.

As shown in FIG. 1, the method according to an embodiment of the present disclosure may comprise the following steps.

S110: A semiconductor substrate is provided, the semiconductor substrate comprising a shallow trench and active areas isolated from the shallow trench.

In the embodiment of the present disclosure, providing a semiconductor substrate may be used to provide an operating platform for subsequent processes. The semiconductor substrate may be made of any base material used to bear elements of a semiconductor integrated circuit. It may be a die, or a wafer processed by an epitaxial growth process. The semiconductor substrate may be, for example, any one or more of a silicon-on-insulator (SOI) substrate, a bulk silicon substrate, a germanium substrate, a silicon germanium substrate, an indium phosphide (InP) substrate, a gallium arsenide (GaAs) substrate, a germanium-on-insulator substrate, etc.

The active area is used to establish the position of the transistor body, on which the source, drain and gate of the transistor are formed. Two active areas may be isolated by STI.

S120: An oxygen-containing layer is formed on the exposed outer surfaces of the shallow trench and the active areas.

In an exemplary embodiment, the oxygen-containing layer may comprise at least one of a linear oxide layer, an oxide/nitride stack structure, and an oxide/nitride/oxide stack structure (ONO structure).

The linear oxide layer may be, for example, an oxide layer formed in a high-temperature furnace. The oxide/nitride stack structure is a structure formed by stacking a nitride layer on an oxide layer and then stacking another oxide layer on the nitride layer, and so on. The structure formed by stacking one on another of oxide layers and nitride layers. Parameters, such as the number and thickness, of the oxide layer and the nitride layer are not limited in the present disclosure. The oxide/nitride/oxide stack structure is a structure formed by stacking at least one oxide layer, nitride layer and oxide layer one on another. Each oxide/nitride/oxide stack structure comprises an oxide layer, a nitride layer and an oxide layer, which are stacked one on another.

S130: A first sacrificial layer of a set height is filled in the shallow trench comprising the oxygen-containing layer on its surface, the set height being lower than the height of the active areas.

In an exemplary embodiment, material for the first sacrificial layer may comprise at least one of oxide, tetraethyl orthosilicate (TEOS), spin-on organic carbon, amorphous carbon, photoresist, and silicon-containing polymer.

In an exemplary embodiment, the method may further comprise: setting the set height according to the depths of the wordline trenches in the active areas.

In the embodiment of the present disclosure, starting from the bottom of the shallow trench, the set height may be, for example, 100 nm to 160 nm, but the present disclosure is not limited thereto. The setting of the set height depends upon the depths of the wordlines to be formed in the active areas, which in turn depends upon the depths of the wordline trenches in the active areas.

S140: An etch stop layer is formed on the upper surface of the first sacrificial layer.

In an exemplary embodiment, the thickness of the etch stop layer may range from 2 nm to 10 nm. For example, the thickness of the etch stop layer may be set to any one of 2 nm, 4 nm, 5 nm, 8 nm, 9 nm or 10 nm. However, the present disclosure is not limited thereto, and the thickness of the etch stop layer may be determined according to actual needs.

In an exemplary embodiment, forming an etch stop layer on the upper surface of the first sacrificial layer may comprise: forming an etch stop layer on the upper surface of the first sacrificial layer and the exposed outer surfaces of the oxygen-containing layer corresponding to the active areas.

In an exemplary embodiment, material for the etch stop layer may comprise at least one of silicon nitride (SiN), silicon carbonitride (SiCN), and silicon oxycarbonitride (SiCON). The etch stop layer may also be called etch termination layer.

S150: The first sacrificial layer below the etch stop layer is removed to form an air gap.

In an exemplary embodiment, removing the first sacrificial layer below the etch stop layer to form an air gap may comprise: forming etching holes in the shallow trench, the etching holes penetrating through the etch stop layer; and pouring an etchant into the first sacrificial layer through the etching holes, and wet etching the first sacrificial layer below the etch stop layer.

In an exemplary embodiment, forming etching holes in the shallow trench may comprise: filling a second sacrificial layer on the etch stop layer in the shallow trench, with the upper surface of the second sacrificial layer being flush with the upper surfaces of the active areas; forming a patterned mask layer above the second sacrificial layer and the active areas, the mask layer is formed with through holes exposing the second sacrificial layer in an edge region of the semiconductor substrate; and etching, by using the mask layer as a mask, the second sacrificial layer to form etching holes communicated with the through holes, the etching holes penetrating through the etch stop layer; and removing the mask layer.

In an exemplary embodiment, material for the second sacrificial layer may comprise at least one of oxide, tetraethyl orthosilicate, spin-on organic carbon, amorphous carbon, photoresist, and silicon-containing polymer.

S160: An isolation layer is filled on the etch stop layer in the shallow trench to form a shallow trench isolation structure containing the air gap.

Specifically, after the second sacrificial layer and the first sacrificial layer are respectively filled above and below the etch stop layer in the shallow trench, a small amount of etching holes may be formed by etching at the edge of the active areas. The first sacrificial layer below the etch stop layer in the STI structure is removed by wet etching to form an air gap. Meanwhile, the second sacrificial layer filled above the etch stop layer in the shallow trench is removed. Then, an isolation layer may be filled on the etch stop layer containing the air gap to form the STI structure containing the air gap.

In an exemplary embodiment, the second isolation layer comprises at least one of an oxide layer, an oxide/nitride stack structure, and an oxide/nitride/oxide stack structure.

S170: The active areas and the shallow trench isolation structure are etched to form wordline trenches, wherein the bottoms of the wordline trenches in the shallow trench isolation structure are higher than the set height.

In an exemplary embodiment, the method may further comprise: forming wordline structures in the wordline trenches, each of the wordline structures comprising a gate oxide layer, a barrier layer, a conductive layer, and a wordline protective cap layer.

In an exemplary embodiment, the bottoms of the wordline trenches in the shallow trench isolation structure and the bottoms of the wordline trenches in the active areas may be both flush with the upper surface of the etch stop layer.

In the embodiment of the present disclosure, WL trenches may be formed in the active areas and the STI structure by photomask etching, respectively. The depths of the wordlines in the active areas were used as a reference to set the set height of the first sacrificial layer and then an etch stop layer is formed on the first sacrificial layer of the set height. Therefore, it is able to avoid the too large depths of the wordline trenches in the STI structure due to the etch selectivity ratio. The depths of the wordline trenches in the active areas and in the STI structure are approximate. Ideally, the depths of the wordline trenches in the active areas and in the STI structure may be made the same. That is, the bottoms of the wordline trenches in the active areas and the bottoms of the wordline trenches in the STI structure are both flush with the upper surface of the etch stop layer so that, in the subsequent process, the depths of the wordlines in the active areas and in the STI structure are the same.

In the method for manufacturing the semiconductor device according to the implementations of the present disclosure, on one hand, an etch stop layer is formed at a set height of the first sacrificial layer in the shallow trench during the formation of the STI so that, during the subsequent formation of the WL trenches by etching, the further etching of the WL trenches in the STI structure can be stopped by the etch stop layer. In this way, the depths of WL trenches almost the same as those of the WL trenches in the active areas may be formed in the STI structure. Since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. Meanwhile, the length of the WLs can be shortened to reduce the conductive resistance. On the other hand, by forming an air gap in the lower part of the STI structure, the isolation effect may be better, and the parasitic capacitance may be further reduced.

The method for manufacturing the semiconductor device in the above embodiment will be described below with reference to FIGS. 2-28.

Figure 2:
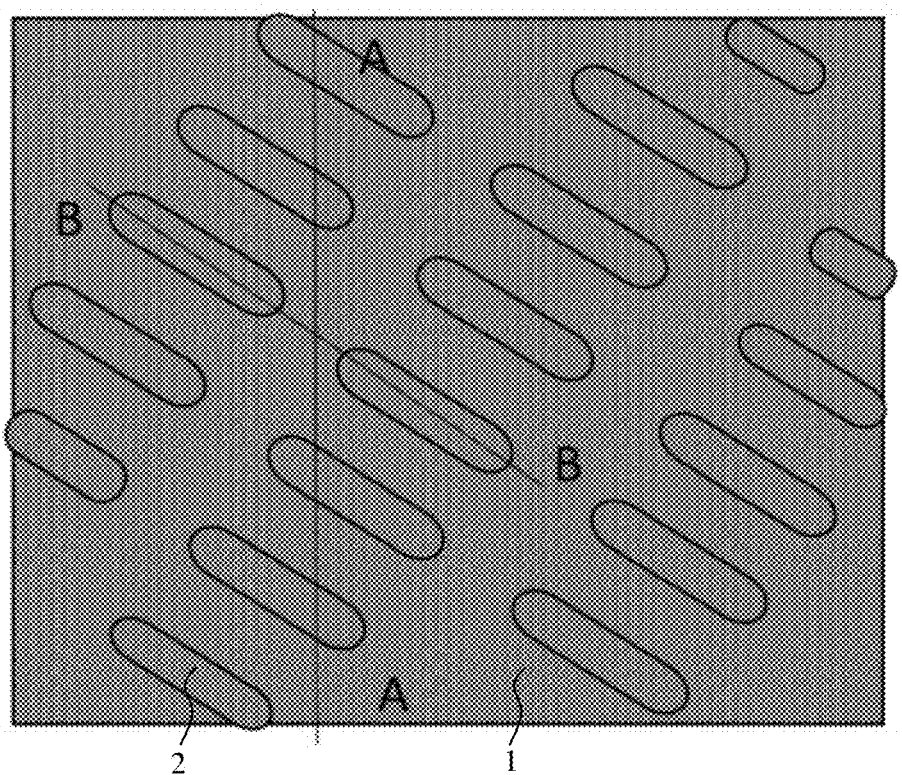
FIGS. 2-28 schematically show a flowchart of a method for manufacturing a semiconductor device according to an embodiment of the present disclosure.
Figure 3:
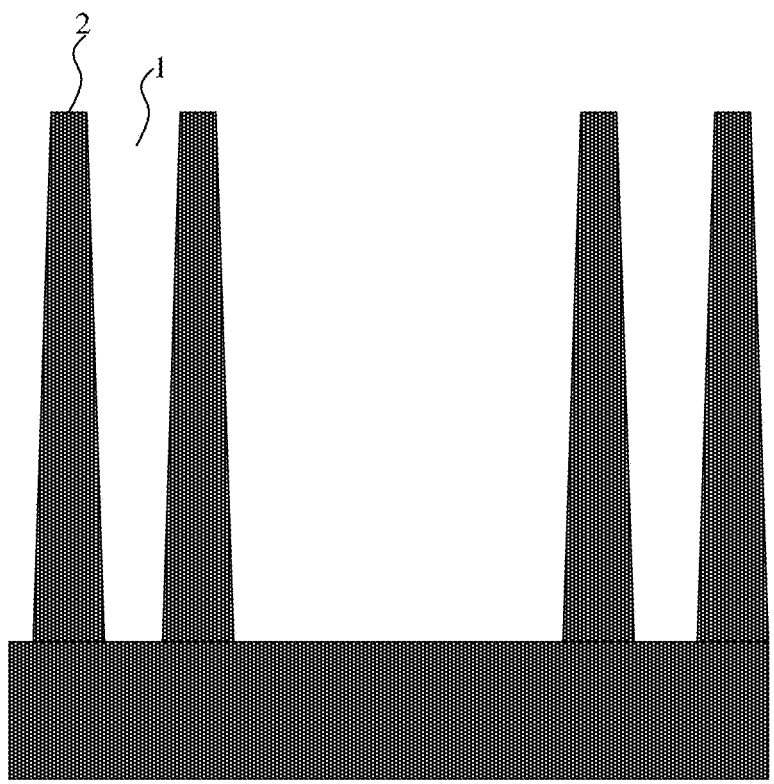
Figure 4:
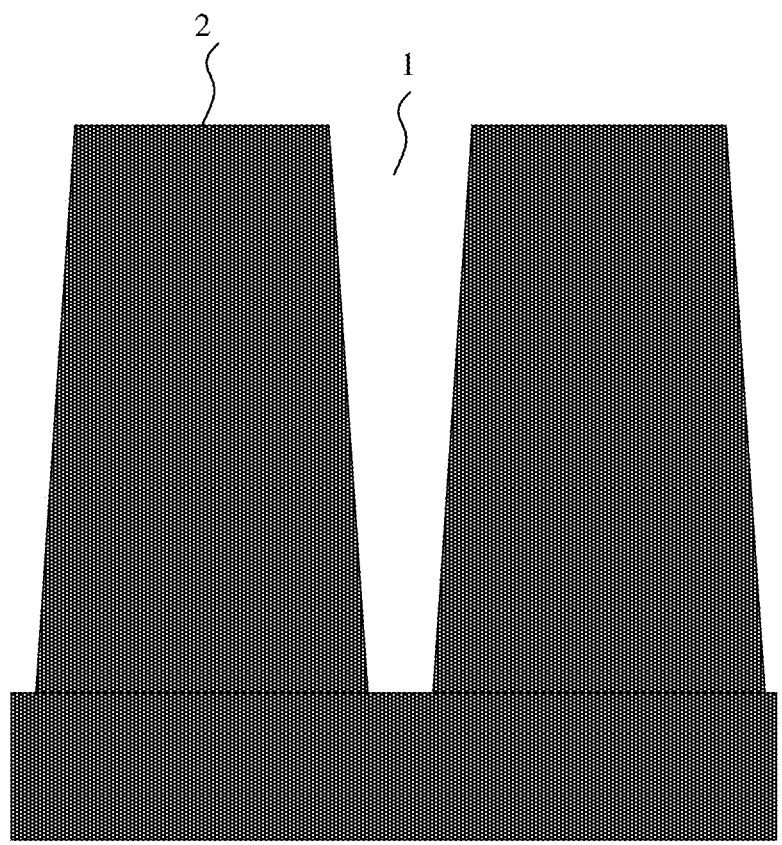

As shown in FIGS. 2-4, the semiconductor substrate comprises a shallow trench 1 and active areas 2 isolated from the shallow trench.

In the embodiment of FIG. 2, in the plane of the surface of the semiconductor substrate, a longitudinal direction (that is, the extension direction AA in FIG. 2 which is a top view) and a transverse direction (not shown, that is, the horizontal direction from left to right in FIG. 2 which is a top view), which are perpendicular to each other, may be pre-defined. For example, when the shallow trench isolation structure is used to define the active areas corresponding to the storage cells in the storage array, the longitudinal direction may be defined as a direction having a certain angle from the extension direction (not shown) of the wordlines or the extension direction (for example, the extension direction BB in FIG. 2 which is a top view) of the bitlines, and the transverse direction is a direction perpendicular to the longitudinal direction. Of course, in other embodiments of the present disclosure, the longitudinal direction may be defined as a direction the same as the extension direction of the wordlines or the extension direction of the bitlines, and the transverse direction is a direction perpendicular to the longitudinal direction. FIG. 3 is a cross-sectional view of FIG. 2 in the direction AA. FIG. 4 is a cross-sectional view of FIG. 2 in the direction BB. The direction BB intersects the direction AA, and may be the extension direction of the active areas.

Figure 5:
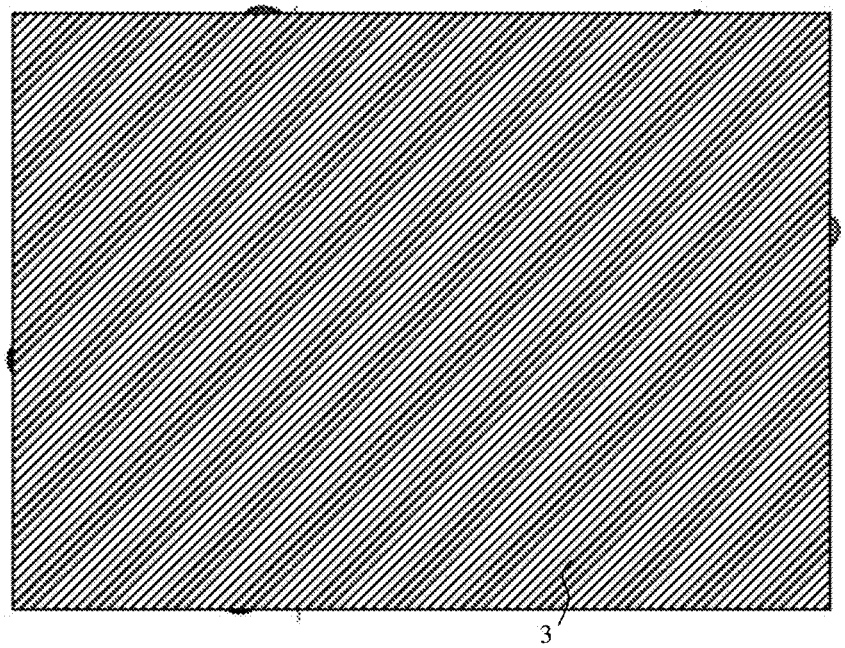
Figure 6:
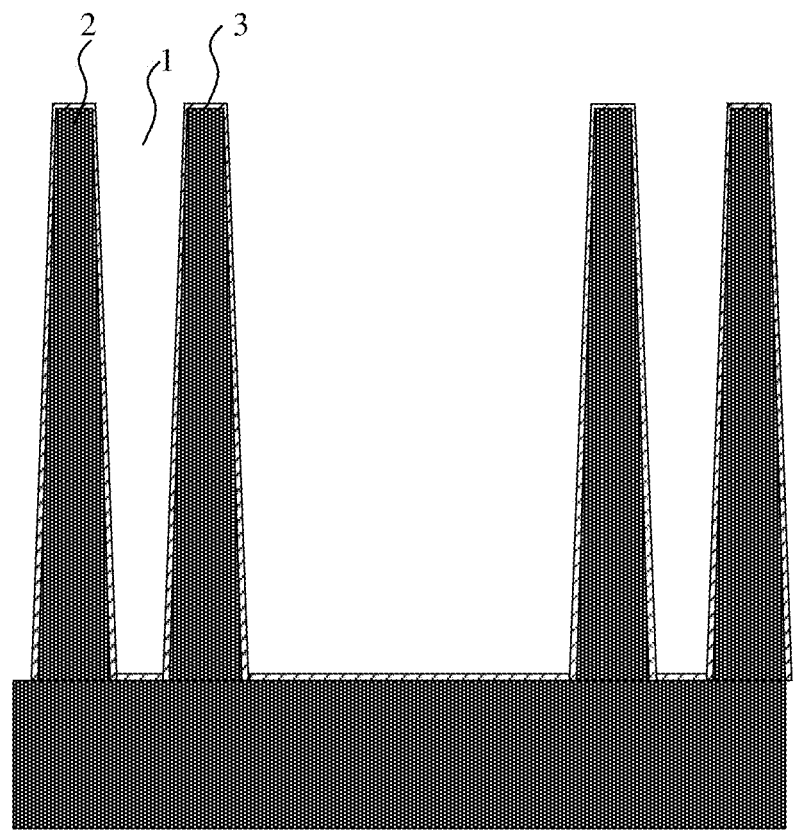
Figure 7:
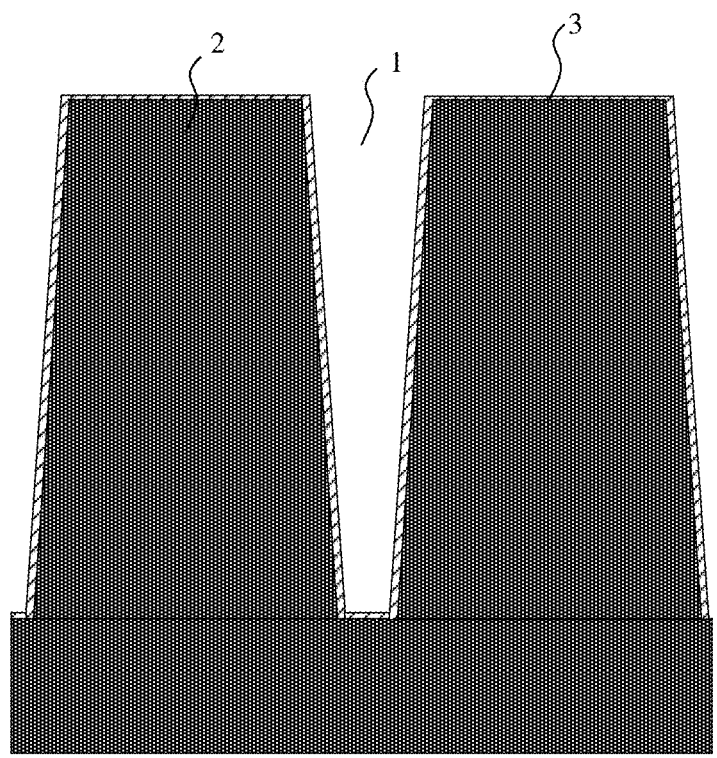

As shown in FIGS. 5-7, an oxygen-containing layer 3 is formed on the exposed outer surfaces of the shallow trench 1 and the active areas 2, for example a liner oxide, oxide/nitride or ONO structure. FIG. 5 is a top view. FIG. 6 is a cross-sectional view of FIG. 5 in the direction AA. FIG. 7 is a cross-sectional view of FIG. 5 in the direction BB.

Figure 8:
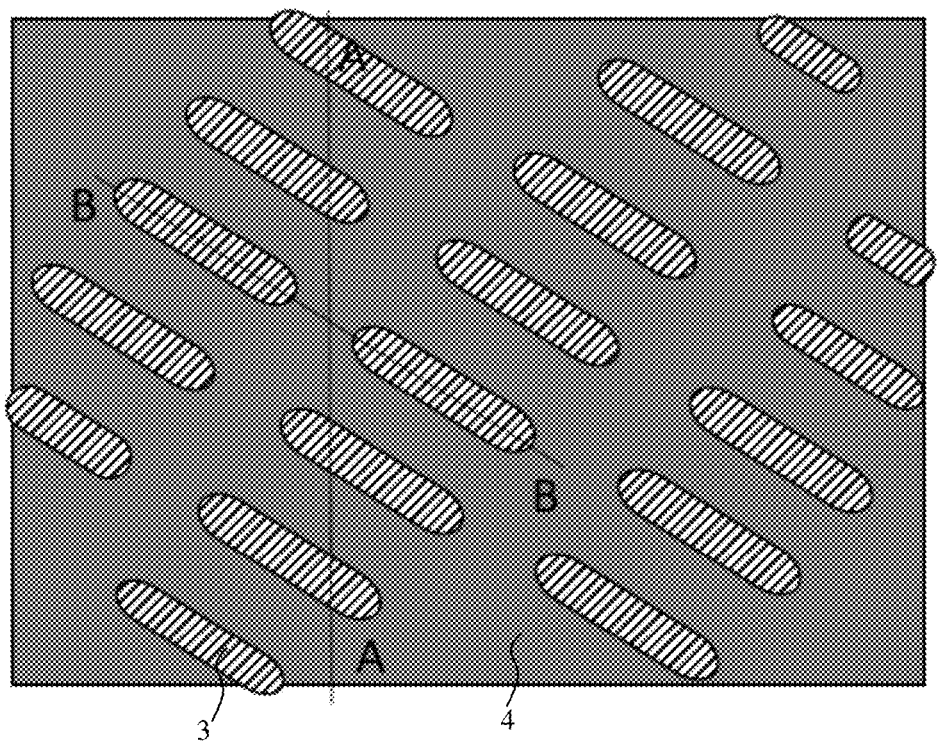
Figure 9:
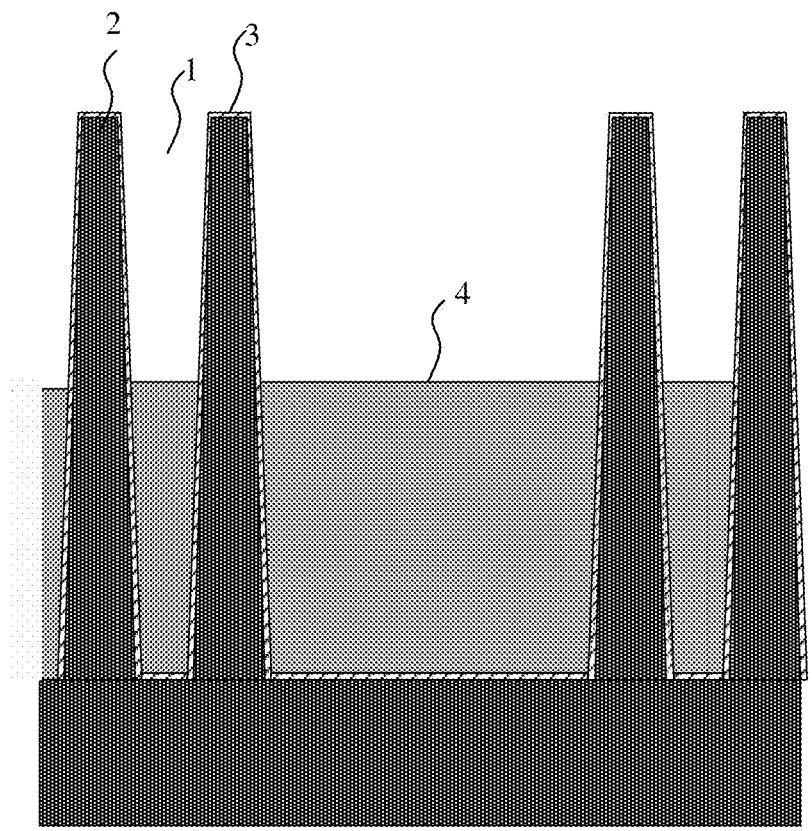
Figure 10:
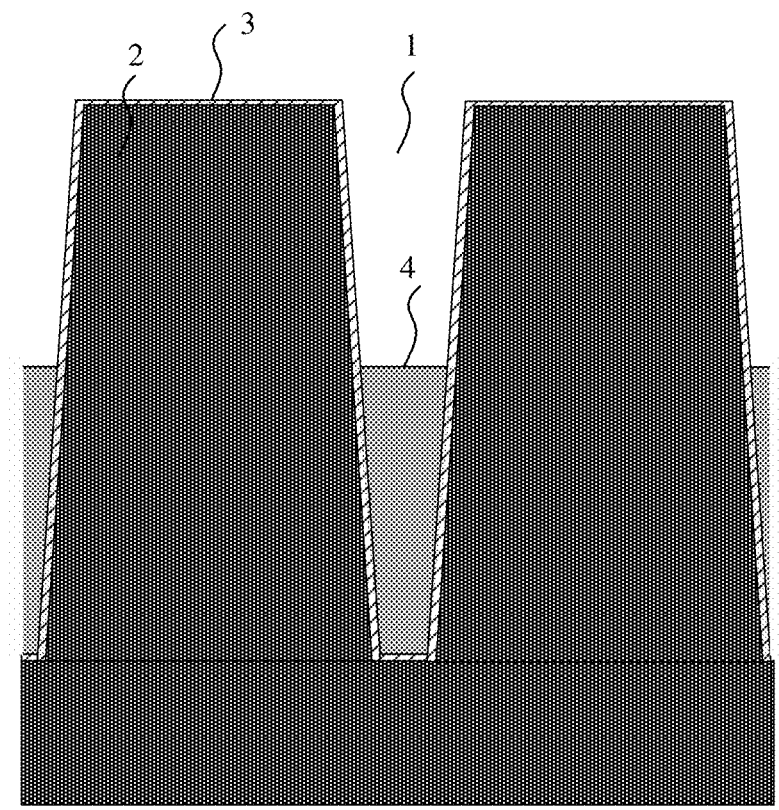

As shown in FIGS. 8-10, a first sacrificial layer 4 of a set height is filled on the shallow trench 1 comprising the oxygen-containing layer 3 on its surface. The first sacrificial layer 4 may be, for example, made of any one or more of oxide, TEOS, spin-on organic carbon, amorphous carbon, photoresist and silicon-containing polymer. FIG. 8 is a top view. FIG. 9 is a cross-sectional view of FIG. 8 in the direction AA. FIG. 10 is a cross-sectional view of FIG. 8 in the direction BB.

Figure 11:
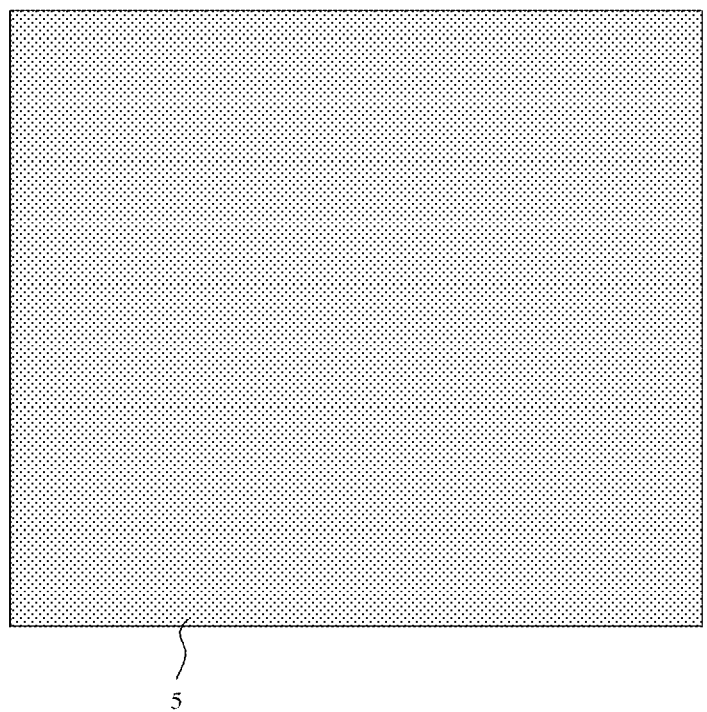
Figure 12:
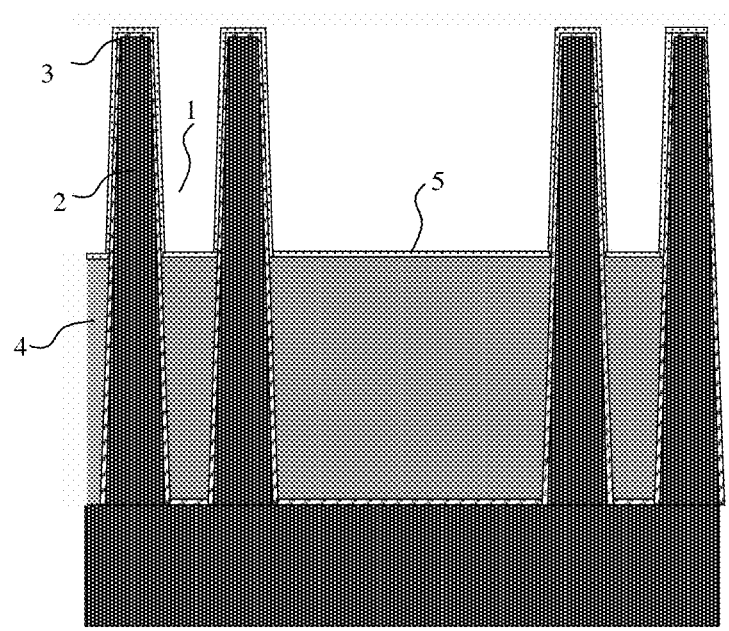
Figure 13:
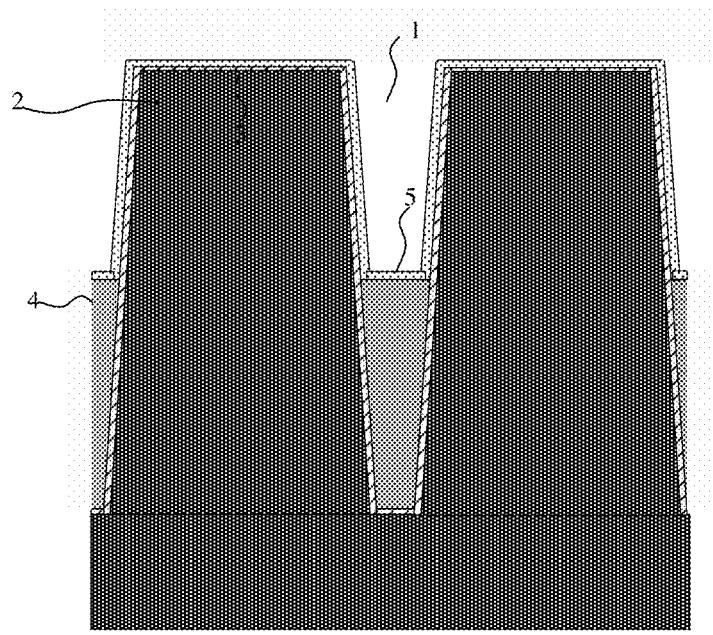

As shown in FIGS. 11-13, an etch stop layer 5 is formed on the upper surface of the first sacrificial layer 4 and the exposed outer surfaces of the oxygen-containing layer 3 corresponding to the active areas 2. The etch stop layer 5 may be made of, for example, any one or more of SiN, SiCN, SiCON, and the like. FIG. 11 is a top view. FIG. 12 is a cross-sectional view of FIG. 11 in the direction AA. FIG. 13 is a cross-sectional view of FIG. 11 in the direction BB.

Figure 14:
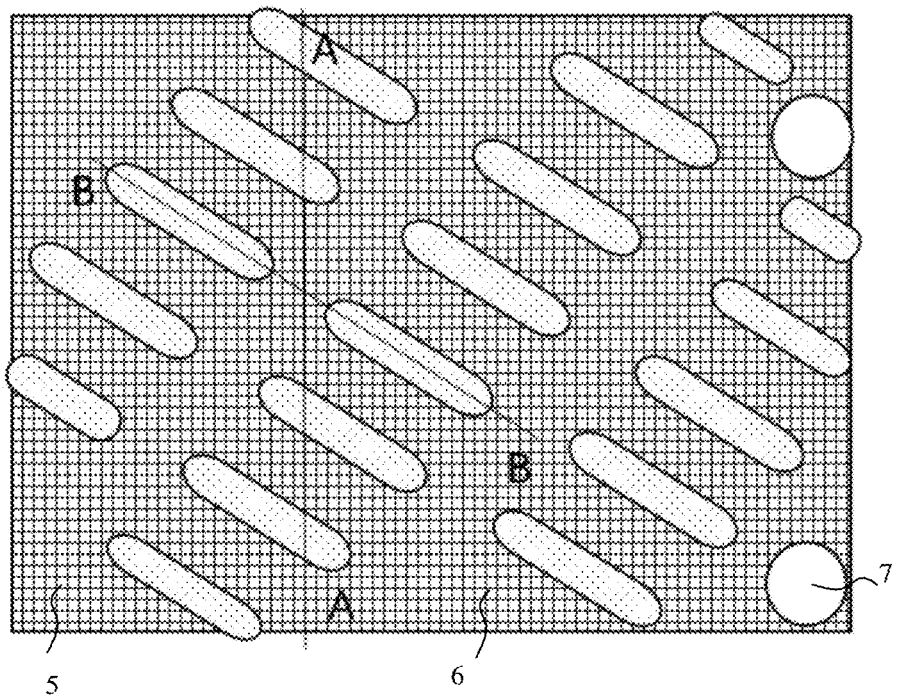
Figure 15:
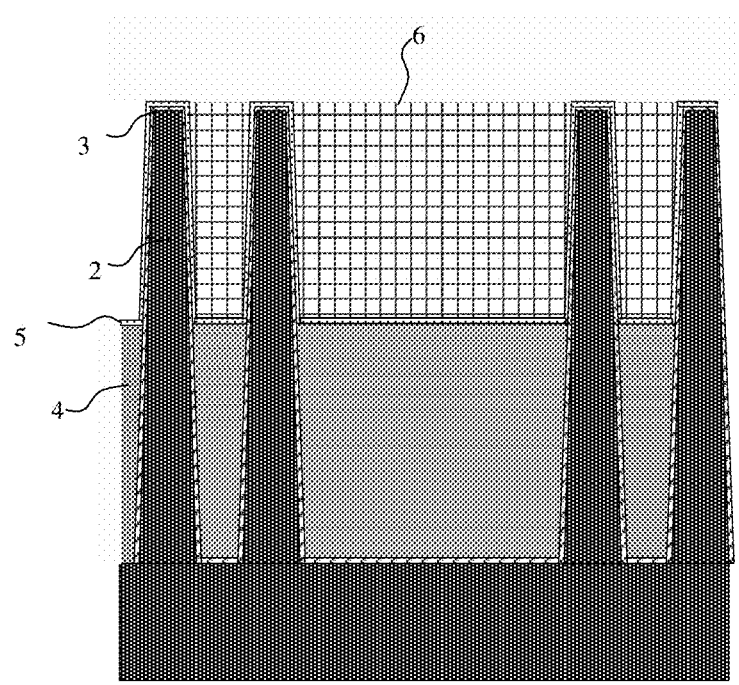
Figure 16:
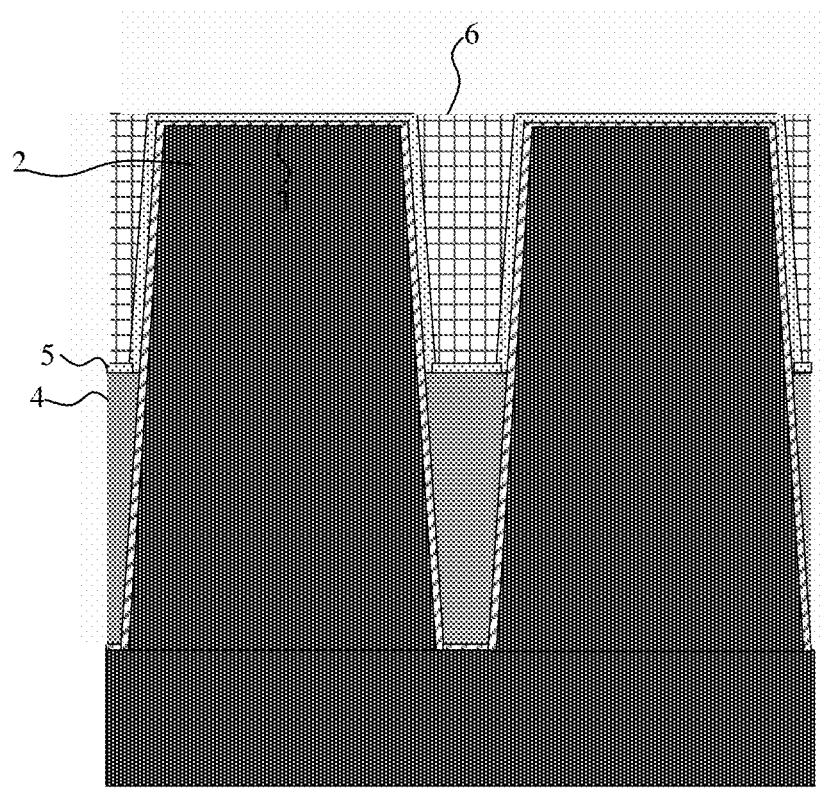

As shown in FIGS. 14-16, a second sacrificial layer 6 is deposited on the etch stop layer 5 in the shallow trench, and the upper surface of the second sacrificial layer 6 is flush with the upper surfaces of the active areas 2. The second sacrificial layer 6 may be made of, for example, any one or more of oxide, TEOS, spin-on organic carbon, amorphous carbon, photoresist, and silicon-containing polymer. FIG. 14 is a top view. FIG. 15 is a cross-sectional view of FIG. 14 in the direction AA. FIG. 16 is a cross-sectional view of FIG. 14 in the direction BB.

Figure 17:
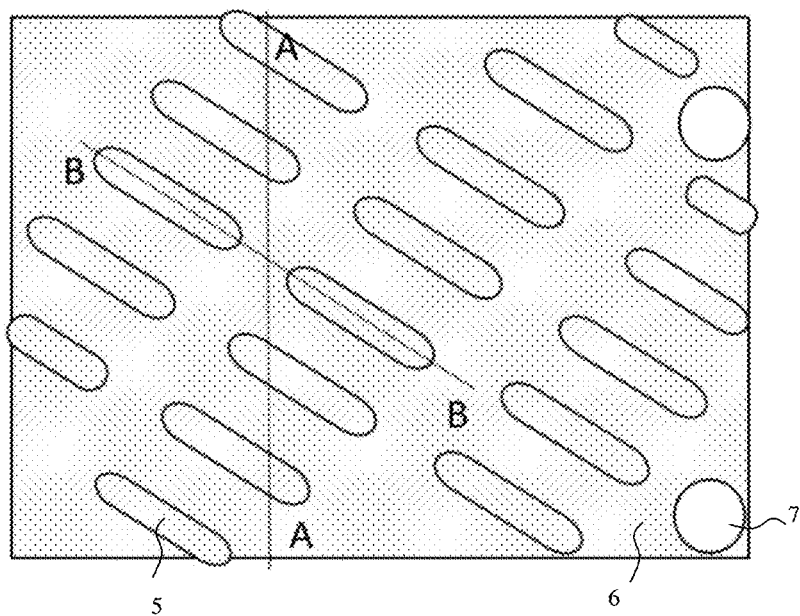
Figure 18:
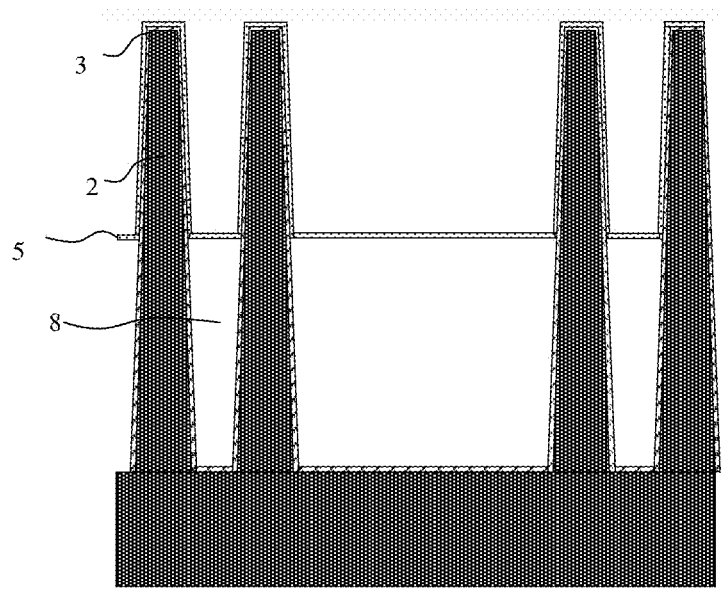
Figure 19:
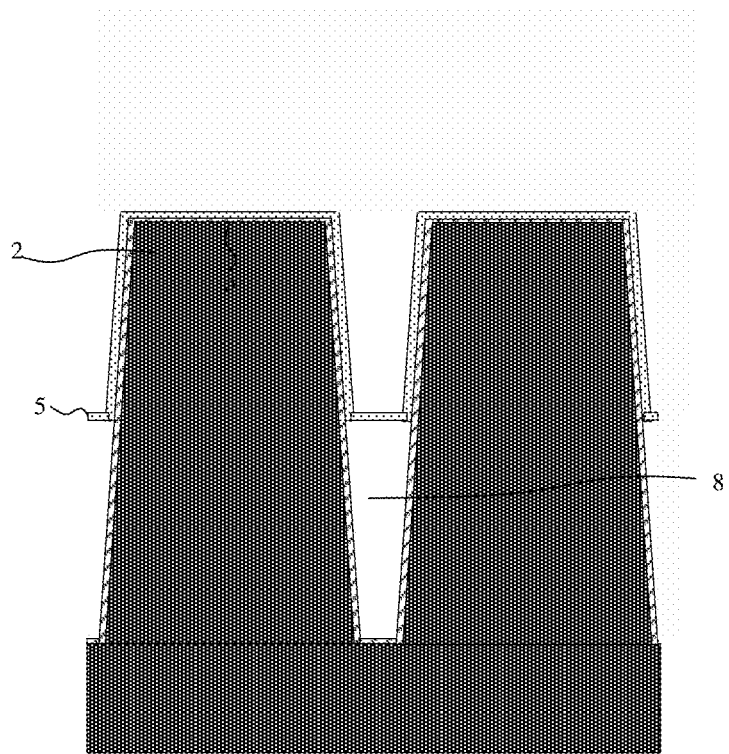

As shown in FIGS. 17-19, by forming a patterned mask layer above the second sacrificial layer 6 and the active areas 2, the mask layer is formed with through holes (not shown) that exposes the second sacrificial layer 6 in the edge region of the semiconductor substrate. By using the mask layer as a mask, the second sacrificial layer 6 is etched to form etching holes 7 communicated with the through holes, and the etching holes 7 penetrate through the etch stop layer 5. Then, the mask layer may be removed, so that an etchant may be poured into the first sacrificial layer 4 from the etching holes 7, to remove the first sacrificial layer below the etch stop layer 5 in the shallow trench 1 and the second sacrificial layer 6 on the etch stop layer 5 in the shallow trench 1 by wet etching to form an air gap 8. FIG. 17 is a top view. FIG. 18 is a cross-sectional view of FIG. 17 in the direction AA. FIG. 19 is a cross-sectional view of FIG. 17 in the direction BB.

In the embodiments of FIGS. 17-19, the sizes of the etching holes 7 are greater than the widths of the active areas 2 and less than the distances between the adjacent active areas 2. The etching holes 7 may be arranged, for example, at the edge of a storage cell array region formed by the active areas 2.

Figure 20:
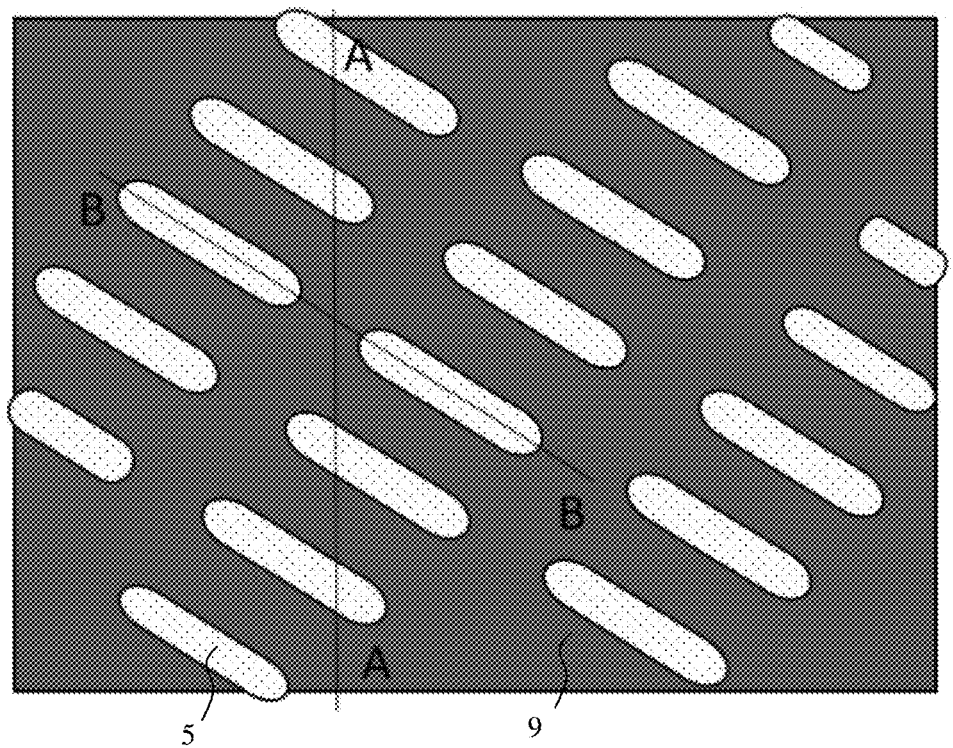
Figure 21:
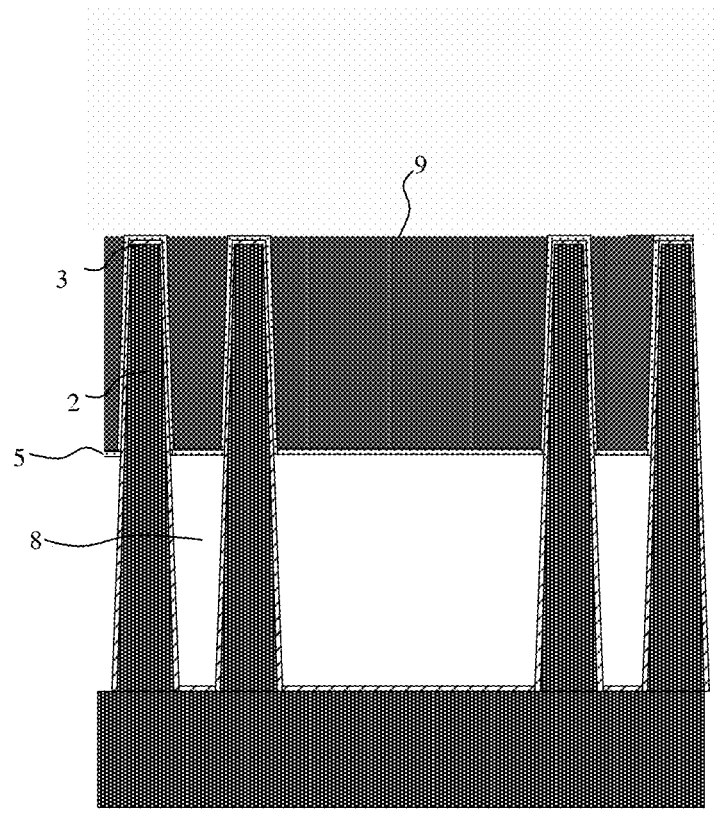
Figure 22:
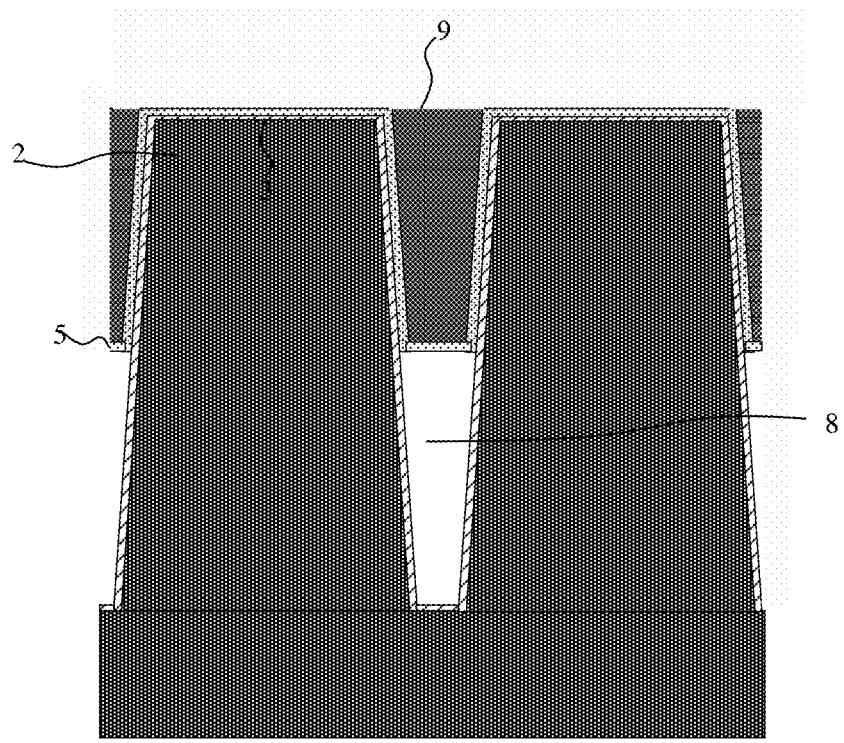

As shown in FIGS. 20-22, an isolation layer 9 is filled on the etch stop layer 5 in the shallow trench 1 to form an STI structure containing an air gap 8. The etching holes 7 at the edge of the active areas 2 will also be filled by the isolation layer 9. The isolation layer 9 may be formed, for example, by depositing an oxide or oxide/nitride or ONO structure. FIG. 20 is a top view. FIG. 21 is a cross-sectional view of FIG. 20 in the direction AA. FIG. 22 is a cross-sectional view of FIG. 20 in the direction BB.

Figure 23:
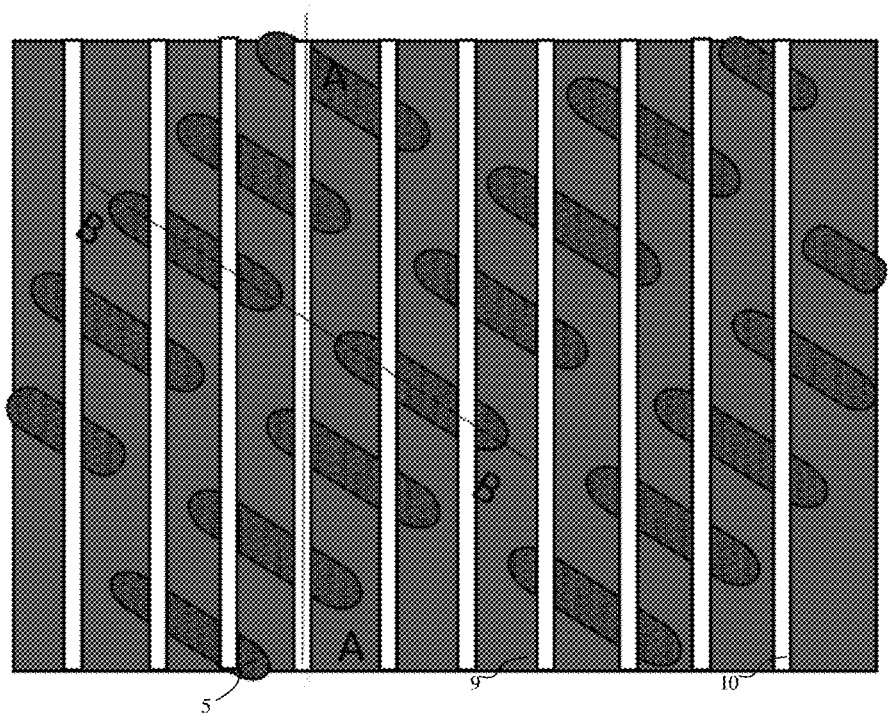
Figure 24:
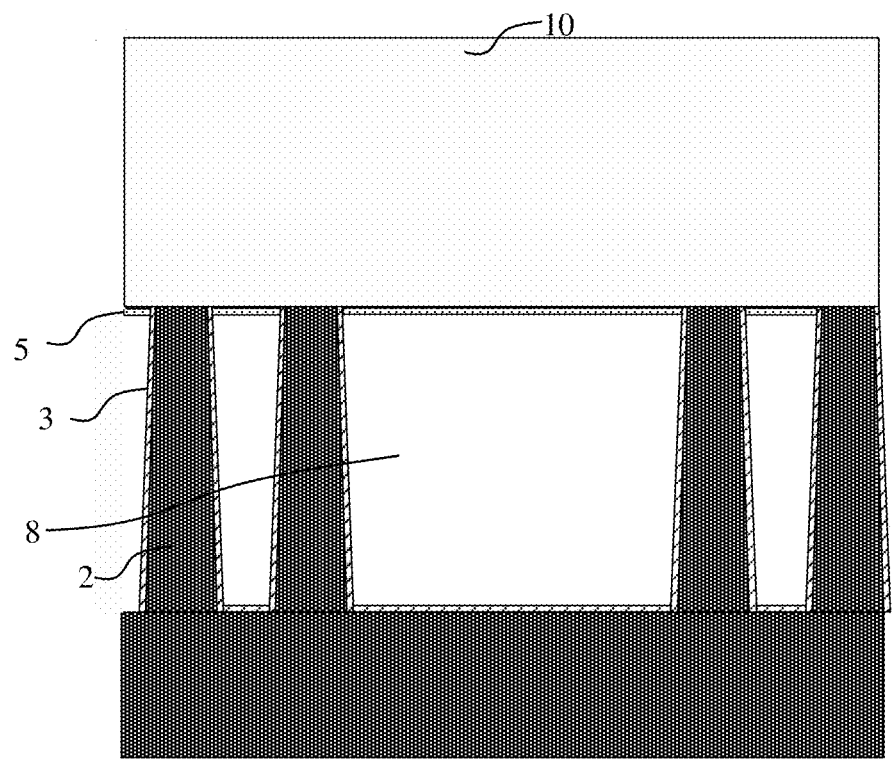
Figure 25:
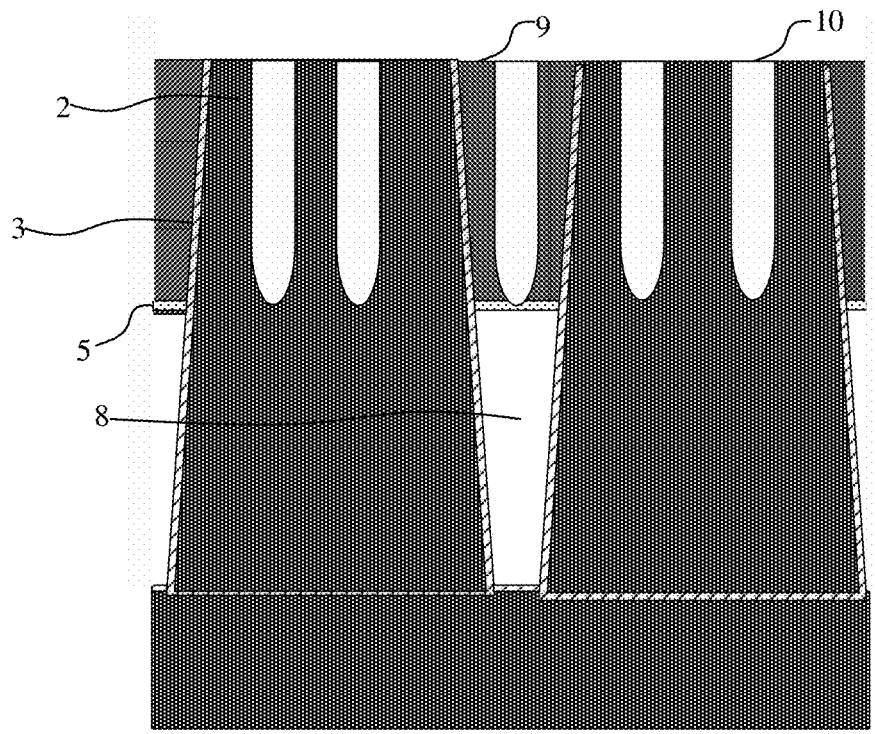

As shown in FIGS. 23-25, the active areas 2 and the STI structure containing the air gap 8 are etched by a photomask etching to form wordline trenches 10 in the active areas and the STI structure, respectively. Because there is an etch stop layer 5 at the bottom of the STI structure, the bottoms of the wordline trenches 10 in the shallow trench isolation structure are higher than the set height. That is, when the wordline trenches 10 in the STI structure are formed by etching, due to the presence of the etch stop layer 5, the depths of the wordline trenches 10 in the STI structure do not exceed the etch stop layer 5, so that the depths of the wordline trenches in the STI structure and the active areas are almost the same. Meanwhile, since the lower part of the STI structure contains the air gap 8, the parasitic capacitance may be further reduced. FIG. 23 is a top view. FIG. 24 is a cross-sectional view of FIG. 23 in the direction AA. FIG. 25 is a cross-sectional view of FIG. 23 in the direction BB.

Figure 26:
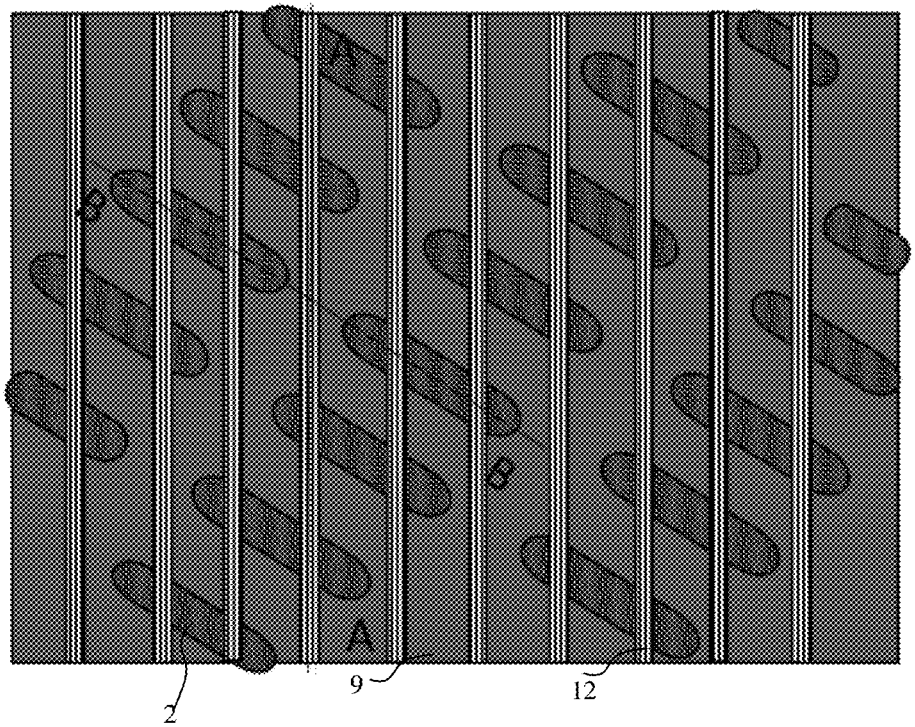
Figure 27:
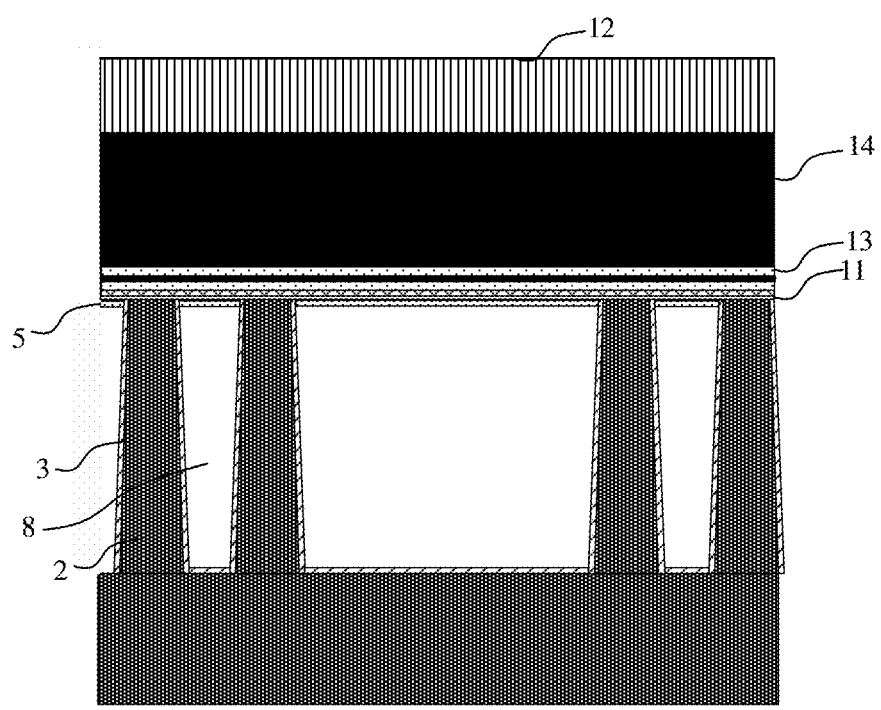
Figure 28:
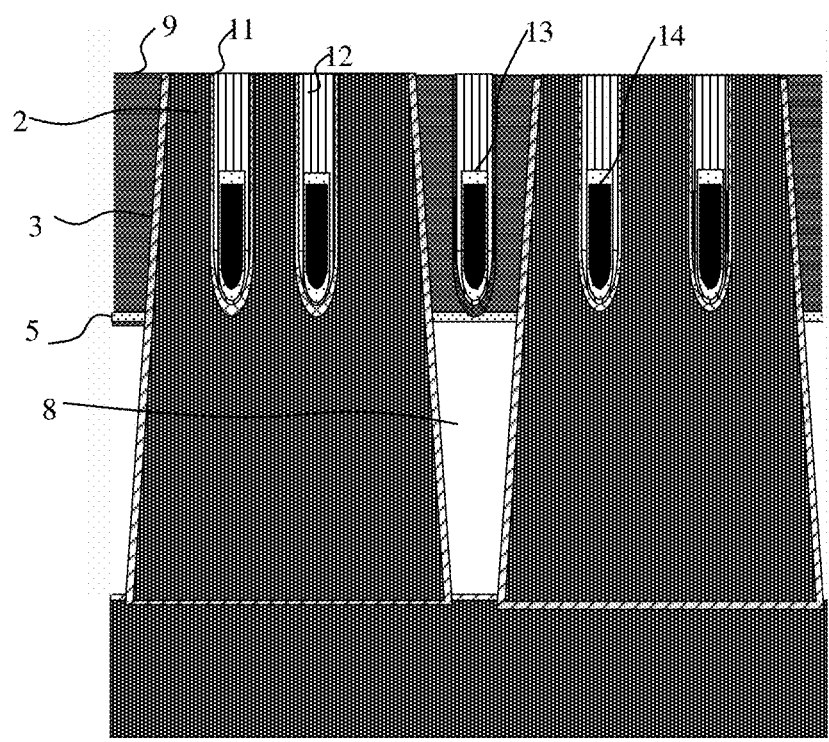

As shown in FIGS. 26-28, a gate oxide layer 11, a barrier layer 13 (for example, it may be made of tin, but the present disclosure is not limited thereto), a conductive layer 14 (for example, it may be made of metal tungsten W, but the present disclosure is not limited thereto), and a wordline protective cap layer 12 (for example, it made be nitride) may be formed in the wordline trenches in the active areas and the STI structure, to form the WL structures in the active areas and in the STI structure. FIG. 26 is a top view. FIG. 27 is a cross-sectional view of FIG. 26 in the direction AA. FIG. 28 is a cross-sectional view of FIG. 26 in the direction BB.

It may be understood that the processes to form the wordline in the wordline trench and the structure of the wordline are not limited in the present disclosure.

In the method for manufacturing the semiconductor device according to the implementations of the present disclosure, on one hand, an etch stop layer is formed at a set height of the first sacrificial layer in the shallow trench during the formation of the STI so that, during the subsequent formation of the WL trenches by etching, the further etching of the WL trenches in the STI structure can be stopped by the etch stop layer. In this way, the depths of WL trenches almost the same as those of the WL trenches in the active areas may be formed in the STI structure. Since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. Meanwhile, the length of the WLs can be shortened to reduce the conductive resistance. On the other hand, by forming an air gap in the lower part of the STI structure, the isolation effect may be better, and the parasitic capacitance may be further reduced.

The method for manufacturing the semiconductor device according to the embodiment of the present disclosure may be applied to the preparation of a semiconductor device with a buried gate structure. For example, the semiconductor device may be a dynamic random access memory (DRAM). DRAM is a semiconductor storage device consisting of many repeated storage cells. Each storage cell usually comprises a capacitor and a transistor. The gate of the transistor is connected to the wordline, the drain of the transistor is connected to the bitline, and the source of the transistor is connected to the capacitor. The voltage signal on the wordline can control the on or off of the transistor. Thus, the data information stored in the capacitor is read through the bitline, or the data information is written into the capacitor for storage through the bitline.

Further, an implementation of the present disclosure further provides a semiconductor device which may comprise a semiconductor substrate. The semiconductor substrate may further comprise a shallow trench and active areas isolated from the shallow trench.

An oxygen-containing layer may be formed at the bottom of the shallow trench and the surfaces of the active areas. The etch stop layer is formed at the set height of the shallow trench, the etch stop layer and the shallow trench forming an air gap, the set height being lower than the heights of the active areas. A shallow trench isolation structure containing the air gap is formed on the etch stop layer in the shallow trench, and the shallow trench isolation structure is formed by filling an isolation layer. Wordline trenches are formed in the shallow trench isolation structure and the active areas, wherein the bottoms of the wordline trenches in the shallow trench isolation structure are higher than the set height.

In the semiconductor device according to the implementations of the present disclosure, on one hand, an etch stop layer is formed at a set height of the first sacrificial layer in the shallow trench during the formation of the STI so that, during the subsequent formation of the WL trenches by etching, the further etching of the WL trenches in the STI structure can be stopped by the etch stop layer. In this way, the depths of WL trenches almost the same as those of the WL trenches in the active areas may be formed in the STI structure. Since the depths of the formed WL trenches in the active areas and the STI structure are almost the same, the bottoms of the metal gates of the WL wordlines subsequently formed in the active areas and the STI structure are almost the same in height in the semiconductor substrate. A nearly straight line may be formed. This can improve the parasitic capacitance formed between the WLs in the STI structure and the active areas and the adjacent WLs, and reduce the current leakage. Meanwhile, the length of the WLs can be shortened to reduce the conductive resistance. On the other hand, by forming an air gap in the lower part of the STI structure, the isolation effect may be better, and the parasitic capacitance may be further reduced.

In an exemplary embodiment, the thickness of the etch stop layer may range from 2 nm to 10 nm.

In an exemplary embodiment, the bottoms of the wordline trenches in the shallow trench isolation structure and the bottoms of the wordline trenches in the active areas may be both flush with the upper surface of the etch stop layer.

In an exemplary embodiment, the surface of the oxygen-containing layer corresponding to the active areas may comprise the etch stop layer.

In an exemplary embodiment, the edge region of the semiconductor substrate may comprise etching holes penetrating through the etch stop layer, the etching holes filled by the isolation layer.

In an exemplary embodiment, material for the first sacrificial layer may comprise at least one of oxide, tetraethyl orthosilicate, spin-on organic carbon, amorphous carbon, photoresist, and silicon-containing polymer.

In an exemplary embodiment, wordline structures may be formed in the wordline trenches. Each of the wordline structures may comprise a gate oxide layer, a barrier layer, a conductive layer, and a wordline protective cap layer.

In an exemplary embodiment, material for the etch stop layer may comprise at least one of silicon nitride, silicon carbonitride, and silicon oxycarbonitride.

Those skilled in the art will readily think of other embodiments of the present disclosure by considering the specification and practicing the invention disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

The invention claimed is:

1. A method for manufacturing a semiconductor device, comprising:
   providing a semiconductor substrate, the semiconductor substrate comprising a shallow trench and active areas isolated from the shallow trench;
   forming an oxygen-containing layer on exposed outer surfaces of the shallow trench and the active areas;
   filling a first sacrificial layer of a set height in the shallow trench comprising the oxygen-containing layer on a surface of the shallow trench, the set height being lower than heights of the active areas;
   forming an etch stop layer on an upper surface of the first sacrificial layer;
   forming etching holes in an edge region of the semiconductor substrate, the etching holes penetrating through the etch stop layer;
   removing the first sacrificial layer below the etch stop layer to form an air gap;
   filling an isolation layer on the etch stop layer in the shallow trench to form a shallow trench isolation structure containing the air gap, wherein the etching holes are filled by the isolation layer; and
   etching the active areas and the shallow trench isolation structure to form wordline trenches, wherein bottoms of the wordline trenches in the shallow trench isolation structure are higher than the set height.

2. The method for manufacturing the semiconductor device according to claim 1, wherein a thickness of the etch stop layer ranges from 2 nm to 10 nm.

3. The method for manufacturing the semiconductor device according to claim 2, wherein the bottoms of the wordline trenches in the shallow trench isolation structure and the bottoms of the wordline trenches in the active areas are both flush with an upper surface of the etch stop layer.

4. The method for manufacturing the semiconductor device according to claim 1, wherein the bottoms of the wordline trenches in the shallow trench isolation structure and the bottoms of the wordline trenches in the active areas are both flush with an upper surface of the etch stop layer.

5. The method for manufacturing the semiconductor device according to claim 1, wherein the forming an etch stop layer on an upper surface of the first sacrificial layer comprises:
   forming the etch stop layer on the upper surface of the first sacrificial layer and exposed outer surfaces of the oxygen-containing layer corresponding to the active areas.

6. The method for manufacturing the semiconductor device according to claim 4, wherein the removing the first sacrificial layer below the etch stop layer to form an air gap comprises:
   pouring an etchant into the first sacrificial layer through the etching holes, and wet etching the first sacrificial layer below the etch stop layer.

7. The method for manufacturing the semiconductor device according to claim 6, wherein the forming etching holes in an edge region of the semiconductor substrate, the etching holes penetrating through the etch stop layer comprises:
   filling a second sacrificial layer on the etch stop layer in the shallow trench, wherein, an upper surface of the second sacrificial layer is flush with upper surfaces of the active areas;
   forming a patterned mask layer above the second sacrificial layer and the active areas, the patterned mask layer is formed with through holes exposing the second sacrificial layer in the edge region of the semiconductor substrate; and
   etching, by using the patterned mask layer as a mask, the second sacrificial layer to form the etching holes in communication with the through holes; and
   removing the patterned mask layer.

8. The method for manufacturing the semiconductor device according to claim 1, wherein the oxygen-containing layer comprises at least one of a linear oxide layer, an oxide/nitride stack structure, or an oxide/nitride/oxide stack structure.

9. The method for manufacturing the semiconductor device according to claim 1, wherein a material for the first sacrificial layer comprises at least one of oxide, tetraethyl orthosilicate, spin-on organic carbon, amorphous carbon, photoresist, or silicon-containing polymer.

10. The method for manufacturing the semiconductor device according to claim 1, wherein the isolation layer comprises at least one of an oxide layer, an oxide/nitride stack structure, or an oxide/nitride/oxide stack structure.

11. The method for manufacturing the semiconductor device according to claim 1, further comprising:
  forming wordline structures in the wordline trenches, each of the wordline structures comprising a gate oxide layer, a barrier layer, a conductive layer, and a wordline protective cap layer.

12. The method for manufacturing the semiconductor device according to claim 1, wherein a material for the etch stop layer comprises at least one of silicon nitride, silicon carbonitride, or silicon oxycarbonitride.

13. A semiconductor device, comprising:
  a semiconductor substrate, comprising:
    a shallow trench; and
    active areas, isolated from the shallow trench; wherein,
      an oxygen-containing layer is formed at a bottom of the shallow trench and surfaces of the active areas;
      an etch stop layer is formed at a set height of the shallow trench, the etch stop layer and the shallow trench forming an air gap, the set height being lower than heights of the active areas;
      a shallow trench isolation structure containing the air gap is formed on the etch stop layer in the shallow trench, and the shallow trench isolation structure is formed by filling an isolation layer;
      wordline trenches are formed in the shallow trench isolation structure and the active areas, wherein bottoms of the wordline trenches in the shallow trench isolation structure are higher than the set height; and
      an edge region of the semiconductor substrate comprises etching holes penetrating through the etch stop layer, the etching holes filled by the isolation layer.

14. The semiconductor device according to claim 13, wherein a thickness of the etch stop layer ranges from 2 nm to 10 nm.

15. The semiconductor device according to claim 14, wherein the bottoms of the wordline trenches in the shallow trench isolation structure and the bottoms of the wordline trenches in the active areas are both flush with an upper surface of the etch stop layer.

16. The semiconductor device according to claim 13, wherein the bottoms of the wordline trenches in the shallow trench isolation structure and the bottoms of the wordline trenches in the active areas are both flush with an upper surface of the etch stop layer.

17. The semiconductor device according to claim 13, wherein a surface of the oxygen-containing layer corresponding to the active areas comprises the etch stop layer.

18. A method for manufacturing a semiconductor device, comprising:
  providing a semiconductor substrate, the semiconductor substrate comprising a shallow trench and active areas isolated from the shallow trench;
  forming an oxygen-containing layer on exposed outer surfaces of the shallow trench and the active areas;
  filling a first sacrificial layer of a set height in the shallow trench comprising the oxygen-containing layer on a surface of the shallow trench, the set height being lower than heights of the active areas;
  forming an etch stop layer on an upper surface of the first sacrificial layer and exposed outer surfaces of the oxygen-containing layer corresponding to the active areas;
  removing the first sacrificial layer below the etch stop layer to form an air gap;
  filling an isolation layer on the etch stop layer in the shallow trench to form a shallow trench isolation structure containing the air gap; and
  etching the active areas and the shallow trench isolation structure to form wordline trenches, wherein bottoms of the wordline trenches in the shallow trench isolation structure are higher than the set height;
  wherein the removing the first sacrificial layer below the etch stop layer to form an air gap comprises:
    forming etching holes in the shallow trench, the etching holes penetrating through the etch stop layer; and
    pouring an etchant into the first sacrificial layer through the etching holes, and wet etching the first sacrificial layer below the etch stop layer; and
  wherein the forming etching holes in the shallow trench comprises:
    filling a second sacrificial layer on the etch stop layer in the shallow trench, wherein, an upper surface of the second sacrificial layer is flush with upper surfaces of the active areas;
    forming a patterned mask layer above the second sacrificial layer and the active areas, the patterned mask layer is formed with through holes exposing the second sacrificial layer in an edge region of the semiconductor substrate; and
    etching, by using the patterned mask layer as a mask, the second sacrificial layer to form the etching holes in communication with the through holes; and
    removing the patterned mask layer.

* * * * *